US012482422B2

(12) United States Patent
Lee et al.

(10) Patent No.: US 12,482,422 B2
(45) Date of Patent: Nov. 25, 2025

(54) PIXEL AND DISPLAY DEVICE INCLUDING THE SAME

(71) Applicant: Samsung Display Co., Ltd., Yongin-Si (KR)

(72) Inventors: Seung Chan Lee, Yongin-si (KR); Wang Jo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/667,355

(22) Filed: May 17, 2024

(65) Prior Publication Data

US 2025/0054442 A1 Feb. 13, 2025

(30) Foreign Application Priority Data

Aug. 10, 2023 (KR) ........................ 10-2023-0104899

(51) Int. Cl.

| | |
|---|---|
| ***G09G 3/3233*** | (2016.01) |
| ***G09G 3/3266*** | (2016.01) |
| ***G09G 3/3283*** | (2016.01) |
| ***H10D 86/40*** | (2025.01) |
| ***H10D 86/60*** | (2025.01) |
| ***H10D 89/60*** | (2025.01) |

(52) U.S. Cl.

CPC ......... *G09G 3/3233* (2013.01); *G09G 3/3266* (2013.01); *G09G 3/3283* (2013.01); *H10D 86/423* (2025.01); *H10D 86/60* (2025.01); *H10D 89/811* (2025.01); *G09G 2300/0819* (2013.01); *G09G 2300/0866* (2013.01)

(58) Field of Classification Search

CPC .. G09G 3/3233; G09G 3/3266; G09G 3/3283; G09G 3/32; G09G 3/3648; G09G 3/3677; G09G 2300/0426; G09G 2300/0852; G09G 2310/0267; G09G 2310/08; G09G 2320/0214; G09G 2330/021; H10D 86/60; H10D 86/423; H10D 89/811; H10D 30/67

USPC .................................................. 345/212, 76

See application file for complete search history.

(56) References Cited

U.S. PATENT DOCUMENTS

| | | | | |
|---|---|---|---|---|
| 11,088,284 B2 | 8/2021 | Son et al. | | |
| 11,217,176 B2 | 1/2022 | Lee et al. | | |
| 2016/0155379 A1* | 6/2016 | Na | ........................ | G09G 3/3233 345/215 |
| 2021/0375193 A1* | 12/2021 | Son | ........................ | G09G 3/3233 |
| 2024/0062710 A1* | 2/2024 | Park | ........................ | G09G 3/3233 |

FOREIGN PATENT DOCUMENTS

KR 10-2021-0024339 A 3/2021

* cited by examiner

*Primary Examiner* — Jimmy H Nguyen
(74) *Attorney, Agent, or Firm* — Innovation Counsel LLP

(57) ABSTRACT

A pixel is disclosed that includes a light emitting element connected between a first power line and a second power line; a first transistor connected between the first power line and a first electrode of the light emitting element, and having a gate electrode connected to a first node; a second transistor connected between a data line and a second node, and having a gate electrode electrically connected to a first scan line; a third transistor connected between the second node and a third node, having a gate electrode electrically connected to a first light emission control line; and a first capacitor connected between the first node and the third node.

16 Claims, 11 Drawing Sheets

PIXEL AND DISPLAY DEVICE INCLUDING THE SAME

CROSS-REFERENCE TO RELATED APPLICATION

This application claims priority to and the benefit of Korean Patent Application No. 10-2023-0104899 filed in the Korean Intellectual Property Office on Aug. 10, 2023, the entire contents of which are incorporated herein by reference.

BACKGROUND

1. Field

The present disclosure relates to a pixel and a display device including the same.

2. Description of the Related Art

As information technology is developed, an importance of a display device, which is a connection medium between users and information, has been highlighted. Therefore, a display device such as a liquid crystal display device, an organic light emitting diode display device, and the like has been increasingly used.

A display device displays images using pixels.

SUMMARY

Pixels of a display device may include a P-type transistor and an N-type transistor for high-speed operation and prevention of leakage current. When the P-type transistor is used as a switching transistor that supplies data signals, leakage current may increase. Additionally, when the N-type transistor is used as a switching transistor, a data signal may not be sufficiently supplied within a desired time (e.g., one horizontal period).

Embodiments may provide a pixel that can stably supply data signals and at the same time minimize leakage current, and a display device including the same.

An embodiment of a pixel includes a light emitting element connected between a first power line and a second power line; a first transistor connected between the first power line and a first electrode of the light emitting element, and having a gate electrode connected to a first node; a second transistor connected between a data line and a second node, and having a gate electrode electrically connected to a first scan line; a third transistor connected between the second node and a third node, having a gate electrode electrically connected to a first light emission control line; and a first capacitor connected between the first node and the third node.

According to an embodiment, the second transistor may be a P-type transistor, and the third transistor may be an N-type transistor.

According to an embodiment, the second transistor may be a polysilicon semiconductor transistor, and the third transistor may be an oxide semiconductor transistor.

According to an embodiment, the second transistor may be turned on after the third transistor is turned on, and the third transistor may be turned off after the second transistor is turned off.

According to an embodiment, a first driving power may be supplied to the first power line, and a second driving power having a lower voltage value than the first driving power may be supplied to the second power line.

According to an embodiment, the pixel may further include a fourth transistor connected between the second node and a third power line supplied with reference power, and having a gate electrode electrically connected to the second scan line; a fifth transistor connected between the first transistor and the first electrode of the light emitting element, and having a gate electrode electrically connected to the first light emission control line; and a second capacitor connected between the first power line and the third node.

According to an embodiment, the fourth transistor may be an N-type transistor, and the fifth transistor may be a P-type transistor.

According to an embodiment, the third transistor and the fifth transistor may be alternately turned on and off.

According to an embodiment, the pixel may further include a sixth transistor connected between the first node and a common node between the first transistor and the fifth transistor, and having a gate electrode electrically connected to the second scan line; a seventh transistor connected between the first node and a fourth power line to which a first initialization power is supplied, and having a gate electrode electrically connected to a third scan line; an eighth transistor connected between the first power line and the first transistor, and having a gate electrode connected to a second light emission control line; a ninth transistor connected between a first electrode of the light emitting element and a fifth power line to which a second initialization power is supplied, and having a gate electrode electrically connected to a fourth scan line; and a tenth transistor connected between a common node between the eighth transistor and the first transistor and a sixth power line to which bias power is supplied, and having a gate electrode electrically connected to the fourth scan line.

According to an embodiment, the eighth transistor, the ninth transistor, and the tenth transistor may be P-type transistors, and the sixth transistor and the seventh transistor may be N-type transistors.

An embodiment of a display device includes a scan driver for driving first scan lines, second scan lines, third scan lines, and fourth scan lines; a data driver for driving data lines; a light emission driver for driving first light emission control lines and second light emission control lines; pixels disposed to be connected to the first scan lines, the second scan lines, the third scan lines, the fourth scan lines, the data lines, the first emission control lines, and the second emission control lines, wherein a first pixel disposed at an i-th (i is a natural number) horizontal line and a j-th (j is a natural number) vertical line includes a light emitting element connected between a first power line and a second power line; a first transistor connected between the first power line and a first electrode of the light emitting element, and having a gate electrode connected to a first node; a second transistor connected between a j-th data line and a second node and turned on when an enable first scan signal is supplied to an i-th first scan line; a third transistor connected between the second node and a third node and turned on when a disable first emission control signal is supplied to an i-th first emission control line; and a first capacitor connected between the first node and the third node.

According to an embodiment, the second transistor may be a P-type transistor, and the third transistor may be an N-type transistor.

According to an embodiment, the second transistor may be a polysilicon semiconductor transistor, and the third transistor may be an oxide semiconductor transistor.

According to an embodiment, the first pixel may further include a fourth transistor connected between the second node and a third power line and turned on when an enable second scan signal is supplied to an i-th second scan line; a fifth transistor connected between the first transistor and a first electrode of the light emitting element and turned on when an enable first light emission control signal is supplied to the i-th first light emission control line; and a second capacitor connected between the first power line and the third node.

According to an embodiment, the third transistor and the fifth transistor may be alternately turned on and off.

According to an embodiment, the first pixel may further include a sixth transistor connected between the first node and a common node between the first transistor and the fifth transistor, and turned on when the enable second scan signal is supplied to the i-th second scan line; a seventh transistor connected between the first node and a fourth power line and turned on when an enable third scan signal is supplied to an i-th third scan line; an eighth transistor connected between the first power line and the first transistor and turned on when an enable second light emission control signal is supplied to an i-th second light emission control line; a ninth transistor connected between a first electrode of the light emitting element and a fifth power line, and turned on when an enable fourth scan signal is supplied to an i-th fourth scan line; and a tenth transistor connected between a common node between the eighth transistor and the first transistor and a sixth power line, and turned on when an enable fourth scan signal is supplied to the i-th fourth scan line.

According to an embodiment, the fifth transistor, the eighth transistor, the ninth transistor, and the tenth transistor may be P-type transistors, and the fourth transistor, the sixth transistor, and the seventh transistor may be N-type transistors.

According to the embodiment, the i-th third scan line may be set as an i−1th second scan line disposed on a previous horizontal line, and the i-th fourth scan line may be set as an i+1th first scan line disposed on a next horizontal line.

According to an embodiment, the display device may further include a power supply unit for supplying a first driving power to the first power line, a second driving power to the second power line, a reference power to the third power line, a first initialization power to the fourth power line, the second initialization power to the fifth power line, and a bias power to the sixth power line.

According to an embodiment, the first driving power may be set to a higher voltage than the second driving power, and the first initialization power and the second initialization power may be set to a lower voltage than the first driving power.

According to the pixel according to the embodiments and the display device including the same, a data signal is transferred to the pixel using a P-type transistor and an N-type transistor, thereby stably supplying the data signal and minimizing leakage current.

It should be understood, however, that the effects of the present disclosure are not limited to the effect described above, and various changes and modifications may be made without departing from the spirit and scope of the disclosure.

DETAILED DESCRIPTION OF THE EMBODIMENTS

Figure 1:
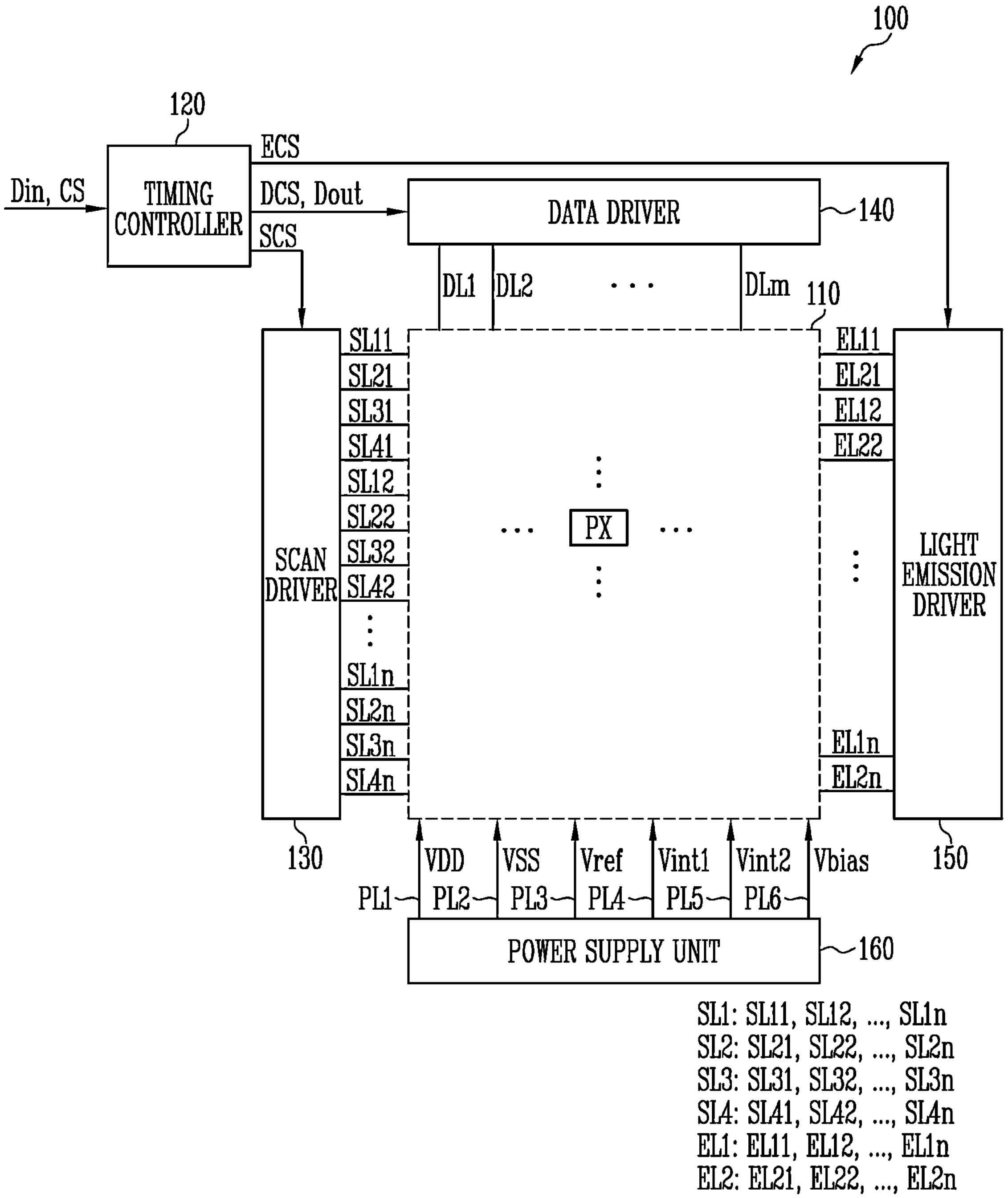
FIG. 1 illustrates an embodiment of a display device.

Hereinafter, with reference to accompanying drawings, various embodiments of the present disclosure will be described in detail so that those skilled in the art can easily carry out the present disclosure. The present disclosure may be embodied in many different forms and is not limited to the embodiments described herein.

In order to clearly illustrate the present disclosure, parts that are not related to the description are omitted, and the same or similar constituent elements are given the same reference numerals throughout the specification. Therefore, the above-mentioned reference numerals can be used in other drawings.

In addition, the expression "the same" in the description may mean "substantially the same". That is, it may be the same degree to which a person with ordinary knowledge can convince as the same. Other expressions may also be expressions in which "substantially" is omitted.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

Some embodiments may be described in the accompanying drawings in relation to functional blocks, units or modules. Those skilled in the art will understand that such blocks, units, or modules are physically implemented by logic circuits, discrete components, microprocessors, hard-wired circuits, memory elements, wiring connections, and other electronic circuits. It may be formed using semiconductor-based manufacturing technology or other manufacturing technology. Blocks, units, or modules implemented by a microprocessor or other similar hardware may be programmed and controlled using software to perform various functions discussed in the present disclosure and may be driven by firmware or software optionally. In addition, each block, unit, or module may be implemented by dedicated hardware, or may be implemented as a combination of a processor (e.g., one or more programmed microprocessors and related circuits) that performs functions different from the dedicated hardware that performs some functions. Further, in some embodiments, blocks, units or modules may be physically separated into two or more individual blocks, units or modules that interact in a scope of a concept of the present disclosure. Further, in some embodiments, blocks, units or modules may be physically combined into more complex blocks, units or modules in the scope of a concept of the present disclosure.

"Connection" between two components may mean using both electrical and physical connections but is not necessarily limited thereto. For example, "connection" used based on a circuit diagram may mean an electrical connection, and "connection" used based on a cross-sectional view and plan view may mean a physical connection.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the present disclosure.

On the other hand, the present disclosure is not limited to embodiments disclosed below, and may be implemented in various forms. In addition, each of the embodiments disclosed below may be implemented alone, or may be implemented in combination with at least one other embodiment.

Figure 2:
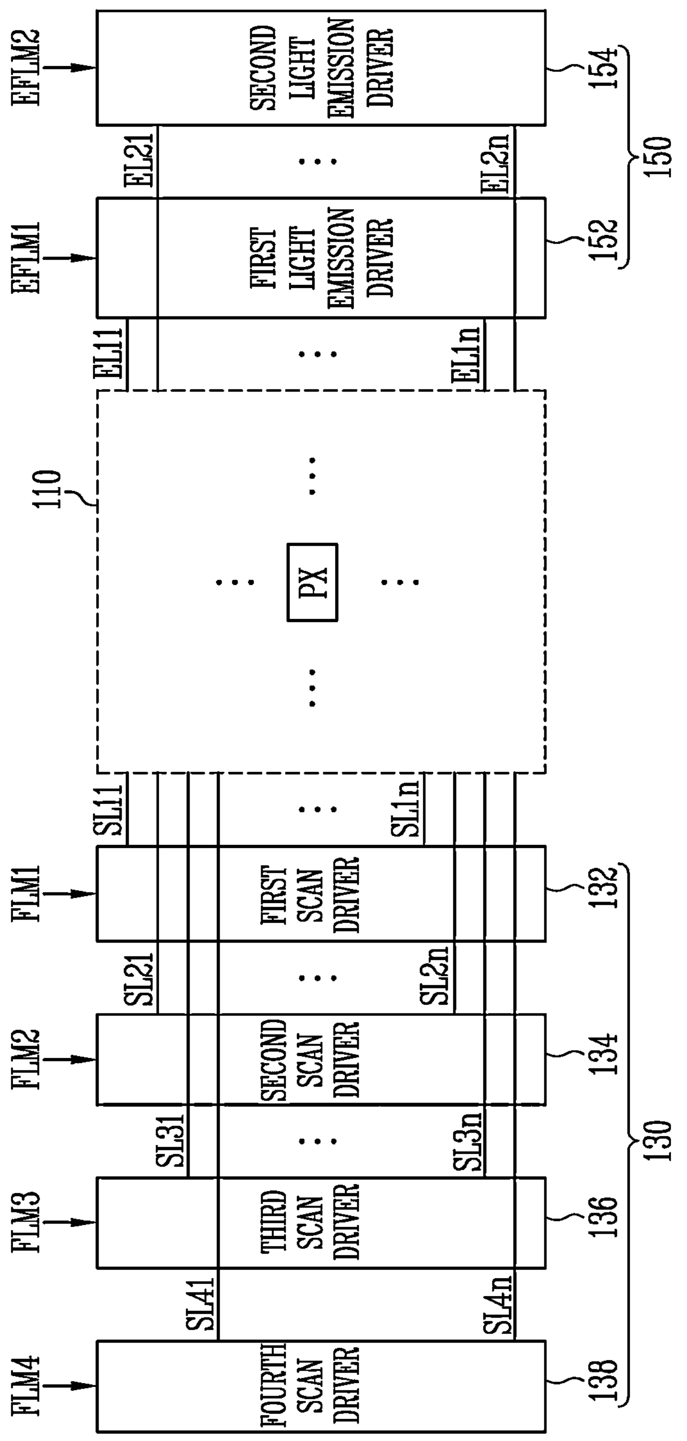
FIG. 2 illustrates an embodiment of a scan driver and a light emission driver shown in FIG. 1.

FIG. 1 illustrates an embodiment of a display device. FIG. 2 illustrates an embodiment of a scan driver and a light emission driver shown in FIG. 1.

Referring to FIG. 1, a display device 100 according to an embodiment includes a pixel unit 110 (or panel), a timing controller 120, a scan driver 130, a data driver 140, a light emission driver 150, and a power supply unit 160. The above-described configurations may be implemented as separate integrated circuits, and two or more of the above-described configurations may be integrated and implemented as one integrated circuit.

The pixel unit 110 may include pixels PX connected to first scan lines SL11, SL12, . . . , and SL1*n*, second scan lines SL21, SL22, . . . , and SL2*n*, third scan lines SL31, SL32, . . . , and SL3*n*, fourth scan lines SL41, SL42, . . . , and SL4*n*, data lines DL1, DL2, . . . , and DLm, first emission control lines EL11, EL12, . . . , and EL1*n*, second emission control lines EL21, EL22, . . . , and EL2*n*, and power lines PL1, PL2, PL3, PL4, PL5, and PL6 (here n and m is a natural number).

For example, the pixel PXij (see FIG. 3) disposed at the i-th horizontal line (or pixel row) and the j-th vertical line (or pixel column) may be connected to the i-th first scan line SL1*i*, the i-th second scan line SL2*i*, the i-th third scan line SL3*i*, the i-th fourth scan line SL4*i*, the i-th first emission control line EL1*i*, the i-th second emission control line EL2*i*, and the j-th data line DLj (here, i is an integer less than or equal to n, and j is an integer less than or equal to m).

When the enable first scan signal is supplied to the first scan lines SL11 to SL1*n*, the pixels PX may be selected in horizontal line units (e.g., pixels PX connected to the same scan line may be classified into one horizontal line (or, pixel row)), and the pixels PX selected by the enable first scan signal may receive a data signal from the data line (any one of DL1 to DLm) connected to the pixel. The pixels PX that receive the data signal may generate light of a predetermined luminance in response to the voltage of the data signal.

The scan driver 130 may receive a scan drive signal SCS from the timing controller 120. The scan drive signal SCS may include at least one scan start signal and clock signals necessary for driving the scan driver 130. The scan driver 130 may generate a first scan signal, a second scan signal, a third scan signal, and a fourth scan signal while shifting the scan start signal in response to the clock signal.

To this end, the scan driver 130 may include a first scan driver 132, a second scan driver 134, a third scan driver 136, and a fourth scan driver 138, as shown in FIG. 2.

The first scan driver 132 may receive a first scan start signal FLM1 and may generate the first scan signal by shifting the first scan start signal FLM1 in response to the clock signal. The first scan driver 132 may sequentially supply the first scan signal to the first scan lines SL11 to SL1*n*.

The second scan driver 134 may receive a second scan start signal FLM2 and may generate the second scan signal by shifting the second scan start signal FLM2 in response to the clock signal. The second scan driver 134 may sequentially supply the second scan signal to the second scan lines SL21 to SL2*n*.

The third scan driver 136 may receive a third scan start signal FLM3 and may generate the third scan signal by shifting the third scan start signal FLM3 in response to the clock signal. The third scan driver 136 may sequentially supply the third scan signal to the third scan lines SL31 to SL3*n*.

The fourth scan driver 138 may receive a fourth scan start signal FLM4 and may generate the fourth scan signal by shifting the fourth scan start signal FLM4 in response to the clock signal. The fourth scan driver 138 may sequentially supply the fourth scan signal to the fourth scan lines SL41 to SL4*n*.

The first scan signal, the second scan signal, the third scan signal, and the fourth scan signal may be set as gate-on voltages so that transistors included in the pixels PX can be turned on. For example, a low-level scan signal may be supplied to a P-type transistor, and a high-level scan signal may be supplied to an N-type transistor.

Thereafter, supplying an enable first scan signal, an enable second scan signal, an enable third scan signal, or an enable fourth scan signal may mean that the gate-on voltage is supplied to the first scan line SL1, the second scan line SL2, the third scan line SL3, or the fourth scan line SL4 so that a transistor can be turned on.

In addition, supplying a disable first scan signal, a disable second scan signal, a disable third scan signal, or a disable fourth scan signal may mean that the gate-off voltage is supplied to the first scan line SL1, the second scan line SL2, the third scan line SL3, or the fourth scan line SL4 so that a transistor can be turned off.

The data driver 140 may receive output data Dout and a data driving signal DCS from the timing controller 120. The data driving signal DCS may include sampling signals or timing signals necessary for driving the data driver 140. The data driver 140 may generate a data signal based on the data driving signal DCS and the output data Dout. For example, the data driver 140 may generate an analog data signal based on a gray level of the output data Dout. The data driver 140 may supply the data signal to the data lines DL1 to DLm in synchronization with the first scan signal.

The light emission driver 150 may receive a light emission drive signal ECS from the timing controller 120. The light emission drive signal ECS may include a light emission start signal and clock signals necessary for driving the light emission driver 150. The light emission driver 150 may generate a first light emission control signal and a second light emission control signal while shifting the light emission start signal in response to the clock signal.

To this end, the light emission driver 150 may include a first light emission driver 152 and a second light emission driver 154 as shown in FIG. 2.

The first light emission driver 152 may receive the first light emission start signal EFLM1 and may generate a first light emission control signal by shifting the first light emission start signal EFLM1 in response to the clock signal. The first emission driver 152 may sequentially supply the first emission control signal to the first emission control lines EL11 to EL1*n*.

The second light emission driver 154 may receive the second light emission start signal EFLM2 and may generate a second light emission control signal by shifting the second light emission start signal EFLM2 in response to the clock signal. The second light emission driver 154 may sequentially supply the second light emission control signal to the second light emission control lines EL21 to EL2*n*.

Thereafter, supplying a disable first emission control signal or a disable second emission control signal may mean that a high voltage is supplied to the first emission control line EL1 or the second emission control line EL2.

Thereafter, supplying an enable first emission control signal or an enable second emission control signal may mean that a low voltage is supplied to the first emission control line EL1 or the second emission control line EL2.

In FIG. 2, the first light emission driver 152 and the second light emission driver 154 are shown to be connected to the first light emission control line EL1 and the second light emission control line EL2, respectively, but the embodiment is not limited thereto. For example, the first emission control line EL1 and the second emission control line EL2 may be driven by one light emission driver.

The timing controller 120 may receive input data Din and a control signal CS from the host system through an interface. For example, the timing controller 120 may receive the input data Din and the control signal CS from at least one of a graphics processing unit GPU, a central processing unit CPU, and an application processor AP included in the host system. The control signal CS may include various signals including a clock signal.

The timing controller 120 may generate a scan drive signal SCS, a data drive signal DCS, and an emission drive signal ECS based on the control signal CS. The scan drive signal SCS, the data drive signal DCS, and the light emission drive signal ECS may be supplied to the scan driver 130, the data driver 140, and the light emission driver 150, respectively.

The timing controller 120 may rearrange the input data Din to match specifications of the display device 100. Additionally, the timing controller 120 may correct the input data Din to generate output data Dout and may supply the output data Dout to the data driver 140. In an embodiment, the timing controller 120 may correct the input data Din in response to optical measurement results measured during the process.

The power supply unit 160 can generate various power sources necessary for driving the display device 100. For example, the power supply unit 160 may generate a first driving power VDD, a second driving power VSS, a reference power Vref, a first initialization power Vint1, a second initialization power Vint2, and a bias power Vbias.

The first driving power VDD may be a power source that supplies driving current to the pixels PX. The second driving power VSS may be a power source that receives driving current from the pixels PX. During a period in which the pixels PX are set to emit light, the first driving power VDD may be set to a higher voltage than the second driving power VSS.

The reference power Vref may be a power source that initializes the capacitor included in each pixel PX. For example, the reference power Vref may be a positive voltage. For example, the reference power Vref may have the same voltage level as the first driving power VDD, but the present disclosure is not limited thereto.

The first initialization power Vint1 and the second initialization power Vint2 may be power sources that initialize the pixels PX. For example, the first initialization power Vint1 may be a power source that initializes the gate electrode of the driving transistor (first transistor M1 in FIG. 3) included in each pixel PX. For example, the second initialization power Vint2 may be a power source that initializes the first electrode (or anode electrode) of the light emitting element LD (see FIG. 3) included in each pixel PX.

The first initialization power Vint1 and the second initialization power Vint2 may be set to the same or different voltages depending on the resolution, inch, etc. of the panel. When the first initialization power Vint1 and the second initialization power Vint2 are set to the same voltage, the second initialization power Vint2 may be replaced by the first initialization power Vint1. The first initialization power Vint1 and the second initialization power Vint2 may be set to a lower voltage than the first driving power VDD.

The bias power Vbias may be a power source for supplying a predetermined bias to the first electrode (or second electrode) of the driving transistor included in each of the pixels PX. For example, the bias power Vbias may be set to a positive voltage so that the driving transistor can be set to an on-bias state, but the present disclosure is not limited thereto. The bias power Vbias may be set to various voltages so that characteristics of the driving transistor are constant.

The first driving power VDD, the second driving power VSS, the reference power Vref, the first initialization power Vint1, the second initialization power Vint2, and the bias power Vbias which are generated in the power supply unit 160 may be supplied to the first power line PL1, the second power line PL2, the third power line PL3, the fourth power line PLA, the fifth power line PL5, and the sixth power line PL6, respectively. The first power line PL1, the second power line PL2, the third power line PL3, the fourth power line PLA, the fifth power line PL5, and the sixth power line PL6 may be commonly connected to the pixels PX, but embodiments of the present disclosure are not limited thereto.

In an embodiment, the first power line PL1 may be composed of a plurality of power lines, and each of the plurality of power lines may be connected to different pixels PX. In an embodiment, the second power line PL2 may be composed of a plurality of power lines, and each of the plurality of power lines may be connected to different pixels PX. In an embodiment, the third power line PL3 may be composed of a plurality of power lines, and each of the plurality of power lines may be connected to different pixels PX. In an embodiment, the fourth power line PLA may be composed of a plurality of power lines, and each of the plurality of power lines may be connected to different pixels PX. In an embodiment, the fifth power line PL5 may be composed of a plurality of power lines, and each of the plurality of power lines may be connected to different pixels PX. In an embodiment, the sixth power line PL6 may be composed of a plurality of power lines, and each of the plurality of power lines may be connected to different pixels PX.

That is, in the embodiment of the present disclosure, the pixels PX may be connected to any one of the first power lines PL1, any one of the second power lines PL2, any one of the third power lines PL3, any one of the fourth power lines PL4, any one of the fifth power lines PL5, and any one of the sixth power lines PL6.

Figure 3:
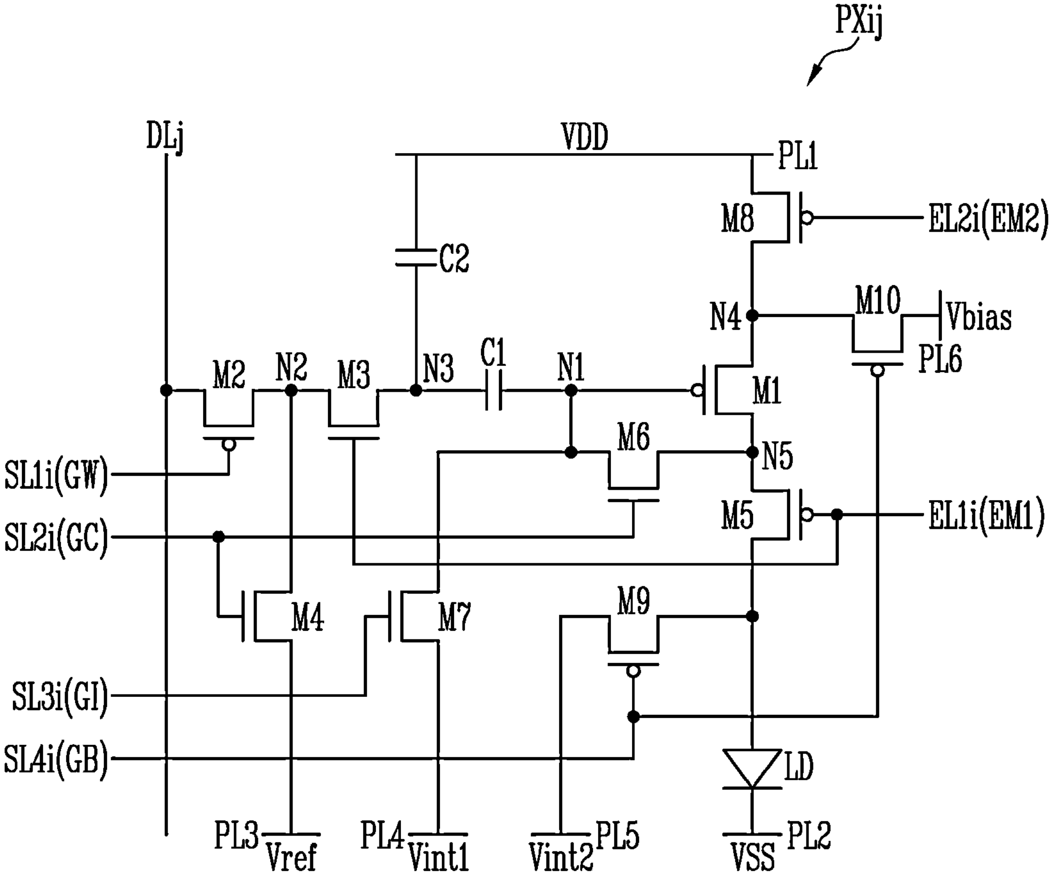
FIG. 3 illustrates an embodiment of a pixel shown in FIG. 1.

FIG. 3 illustrates an embodiment of a pixel shown in FIG. 1. FIG. 3 shows pixels disposed at the i-th horizontal line and the j-th vertical line.

Referring to FIG. 3, the pixel PXij according to the embodiment may be connected to the corresponding signal lines SL1*i*, SL2*i*, SL3*i*, SL4*i*, EL1*i*, EL2*i*, and DLj. For example, the pixel PXij may be connected to the i-th first scan line SL1*i*, the i-th second scan line SL2*i*, the i-th third scan line SL3*i*, the i-th fourth scan line SL4*i*, and the i-th first light emission control line EL1*i*, the i-th second emission control line EL2*i*, and the j-th data line DLj. In an embodiment, the pixel PXij may be further connected to the first power line PL1, the second power line PL2, the third power line PL3, the fourth power line PLA, the fifth power line PL5, and the sixth power line PL6.

The pixel PXij according to an embodiment may include a light emitting element LD and a pixel circuit for controlling the amount of current supplied to the light emitting element LD.

The light emitting element LD may be connected between the first power line PL1 and the second power line PL2. For example, the first electrode (or anode electrode) of the light emitting element LD may be electrically connected to the first power line PL1 via the fifth transistor M5, the fifth node N5, the first transistor M1, the fourth node N4, and the eighth transistor M8, and the second electrode (or cathode electrode) of the light emitting element LD may be electrically connected to the second power line PL2. The light emitting element LD may generate light with a predetermined luminance in response to the amount of current supplied from the first power line PL1 to the second power line PL2 via the pixel circuit.

The light emitting element LD may be selected as an organic light emitting diode. Additionally, the light emitting element LD may be selected as an inorganic light emitting diode, such as a micro-LED (light emitting diode) or a quantum dot light emitting diode. Additionally, the light emitting element LD may be a element composed of a composite of organic and inorganic materials. In FIG. 3, the pixel PXij is shown as including a single light emitting element LD. However, in another embodiment, the pixel PXij may include a plurality of light emitting elements LD and the plurality of light emitting elements LD may be connected to each other in series, parallel, or series-parallel.

The pixel circuit may include a first transistor M1 (or driving transistor), a second transistor M2, a third transistor M3, a fourth transistor M4, a fifth transistor M5, a sixth transistor M6, a seventh transistor M7, an eighth transistor M8, a ninth transistor M9, a tenth transistor M10, a first capacitor C1, and a second capacitor C2.

A first electrode of the first transistor M1 may be connected to the first power line PL1 via the fourth node N4 and the eighth transistor M8, and a second electrode thereof may be connected to the first electrode of the light emitting element LD via the fifth node N5 and the fifth transistor M5. Here, "being connected" includes the meaning of being electrically connected. A gate electrode of the first transistor M1 may be connected to the first node N1. The first transistor M1 may control the amount of current supplied from the first driving power VDD to the second driving power VSS via the light emitting element LD in response to the voltage of the first node N1.

The second transistor M2 may be connected between the data line DLj and the second node N2. Additionally, a gate electrode of the second transistor M2 may be electrically connected to the first scan line SL1*i*. The second transistor M2 may be turned on when the enable first scan signal GW (or low voltage) is supplied to the first scan line SL1*i* and may electrically connect the data line DLj and the second node N2.

The third transistor M3 may be connected between the second node N2 and the third node N3. Additionally, a gate electrode of the third transistor M3 may be electrically connected to the first emission control line EL1*i*. This third transistor M3 may be turned on when the disable first light emission control signal EM1 (or high voltage) is supplied to electrically connect the second node N2 and the third node N3.

The fourth transistor M4 may be connected between the second node N2 and the third power line PL3. Additionally, a gate electrode of the fourth transistor M4 may be electrically connected to the second scan line SL2*i*. The fourth transistor M4 may be turned on when the enable second scan signal GC (or high voltage) is supplied to the second scan line SL2*i*. When the fourth transistor M4 is turned on, the voltage of the reference power Vref is supplied to the second node N2.

The fifth transistor M5 may be connected between the fifth node N5 and the first electrode of the light emitting element LD. Additionally, a gate electrode of the fifth transistor M5 may be electrically connected to the first light emission control line EL1*i*. The fifth transistor M5 may be turned on when the enable light emission control signal EM1 (or low voltage) is supplied to the first light emission control line EL1*i* and may electrically connect the fifth node N5 and the first electrode of the light emitting element LD. The fifth transistor M5 may be turned on and off alternately with the third transistor M3. The fifth node N5 may refer to a common node between the first transistor M1 and the fifth transistor M5.

The sixth transistor M6 may be connected between the first node N1 and the fifth node N5. Additionally, a gate electrode of the sixth transistor M6 may be electrically connected to the second scan line SL2*i*. The sixth transistor M6 may be turned on when the enable second scan signal GC (or high voltage) is supplied to the second scan line SL2*i* and may electrically connect the first node N1 and the fifth node N5. When the sixth transistor M6 is turned on, the first transistor M1 may be connected with a diode.

The seventh transistor M7 may be connected between the first node N1 and the fourth power line PL4. Additionally, a gate electrode of the seventh transistor M7 may be electrically connected to the third scan line SL3*i*. The seventh transistor M7 may be turned on when the enable third scan signal GI (or high voltage) is supplied to the third scan line SL3*i*. When the seventh transistor M7 is turned on, the voltage of the first initialization power Vint1 is supplied to the first node N1.

The eighth transistor M8 may be connected between the first power line PL1 and the fourth node N4. Additionally, a gate electrode of the eighth transistor M8 may be electrically connected to the second emission control line EL2*i*. The eighth transistor M8 may be turned on when the enable second light emission control signal EM2 (or low voltage) is supplied to the second light emission control line EL2*i* and may electrically connect the first power line PL1 and the fourth node N4. The fourth node N4 may refer to the common node of the eighth transistor M8 and the first transistor M1.

The ninth transistor M9 may be connected between the first electrode of the light emitting element LD and the fifth power line PL5. Additionally, a gate electrode of the ninth transistor M9 may be electrically connected to the fourth scan line SL4*i*. The ninth transistor M9 may be turned on when the enable fourth scan signal GB is supplied to the fourth scan line SL4*i*. When the ninth transistor M9 is turned on, the voltage of the second initialization power Vint2 is supplied to the first electrode of the light emitting element LD.

The tenth transistor M10 may be connected between the fourth node N4 and the sixth power line PL6. Additionally, a gate electrode of the tenth transistor M10 may be electrically connected to the fourth scan line SL4*i*. The tenth transistor M10 may be turned on when the enable fourth scan signal GB is supplied to the fourth scan line SL4*i*. When the tenth transistor M10 is turned on, the voltage of the bias power Vbias is supplied to the fourth node N4.

The first capacitor C1 may be connected between the first node N1 and the third node N3. This first capacitor C1 may be driven as a coupling capacitor. For example, the first capacitor C1 may change the voltage of the first node N1 in response to a change in the voltage of the third node N3. Additionally, the first capacitor C1 may maintain the voltage of the first node N1 for a predetermined period (e.g., one frame period).

The second capacitor C2 may be connected between the first power line PL1 and the third node N3. This second capacitor C2 may store the voltage of the third node N3.

In an embodiment, the first transistor M1, the second transistor M2, the fifth transistor M5, the eighth transistor M8, the ninth transistor M9, and the tenth transistor M10 may be formed as a polysilicon semiconductor transistor. For example, the first transistor M1, the second transistor M2, the fifth transistor M5, the eighth transistor M8, the ninth transistor M9, and the tenth transistor M10 may include a polysilicon semiconductor layer formed through a low temperature polysilicon (LTPS) process as active layers (channels). In addition, the first transistor M1, the second transistor M2, the fifth transistor M5, the eighth transistor M8, the ninth transistor M9, and the tenth transistor M10 may be P-type transistors (e.g., PMOS transistor). Accordingly, the gate-on voltage that turns on the first transistor M1, the second transistor M2, the fifth transistor M5, the eighth transistor M8, the ninth transistor M9, and the tenth transistor M10 may be a logic low level. Since the polysilicon semiconductor transistor has an advantage of a fast response speed, it can be applied to a switching element requiring fast switching.

In an embodiment, the third transistor M3, the fourth transistor M4, the sixth transistor M6, and the seventh transistor M7 may be formed of oxide semiconductor transistors. For example, the third transistor M3, the fourth transistor M4, the sixth transistor M6, and the seventh transistor M7 may be N-type oxide semiconductor transistors (e.g., NMOS transistors) and may include an oxide semiconductor layer as an active layer. Accordingly, the gate-on voltage that turns on the third transistor M3, the fourth transistor M4, the sixth transistor M6, and the seventh transistor M7 may be at a logic high level.

The oxide semiconductor transistor can be processed at a low temperature and can have a lower charge mobility than the polysilicon semiconductor transistor. That is, the oxide semiconductor transistor can have excellent off-current characteristics. Therefore, when the third transistor M3, the fourth transistor M4, the sixth transistor M6, and the seventh transistor M7 are formed as oxide semiconductor transistors, leakage current from the first node N1, the second node N2, and the third node N3 can be minimized, and thus display quality can be improved.

Additionally, in an embodiment, a P-type second transistor M2 and an N-type third transistor M3 may be connected in series between the data line DLj and the third node N3. That is, in the embodiment, the second transistor M2 and the third transistor M3 may be driven as switching transistors that transfer data signals.

When the P-type second transistor M2 is connected to the data line DLj, the data signal from the data line DLj can be stably transferred to the second node N2 (and the third node N3). When the N-type third transistor M3 is connected to the third node N3, leakage current from the third node N3 can be minimized. To this end, the third transistor M3 may be set to the turn-on state before the second transistor M2 and may be turned off after the second transistor M2 is turned off.

For example, when the third transistor M3 is removed from the pixel PXij and only the P-type second transistor M2 is included therein, display quality may be deteriorated due to the leakage current from the third node N3.

Figure 4:
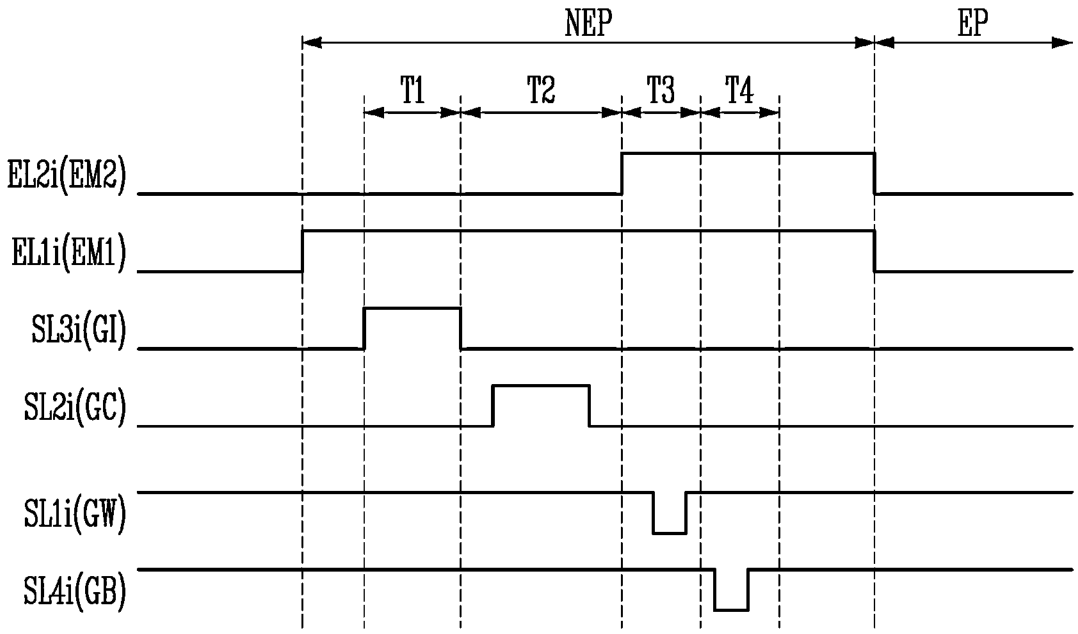
FIG. 4 is a timing diagram illustrating an embodiment of a driving method of a pixel shown in FIG. 3.

For example, when the second transistor M2 is removed from the pixel PXij and only the N-type third transistor M3 is included therein, the voltage of the data signal from the data line DLj may not be transferred to the third node N3 within a predetermined time (e.g., one horizontal period). In this case, the pixel PXij does not generate light of the desired luminance. FIG. 4 is a timing diagram illustrating an embodiment of a driving method of a pixel shown in FIG. 3.

Referring to FIG. 4, during one frame period, the pixel PXij may include at least one non-emission section NEP and at least one emission section EP.

During the non-emission section NEP, the disable first emission control signal EM1 is supplied to the first emission control line EL1*i*. When the disable first emission control signal EM1 is supplied to the first emission control line EL1*i*, the fifth transistor M5 is turned off and the third transistor M3 is turned on. When the fifth transistor M5 is turned off, the pixel PXij is set to a non-emission state.

During the first section T1 of the non-emission section NEP, the enable third scan signal GI is supplied to the third scan line SL3*i*, so that the seventh transistor M7 is turned on. During this first section T1, the voltage of the first node N1 may be initialized.

During the second section T2 of the non-emission section NEP, the enable second scan signal GC is supplied to the second scan line SL2*i*, so that the fourth transistor M4 and the sixth transistor (M6) are turned on. During this second section T2, the threshold voltage of the first transistor M1 may be compensated.

During the third section T3 of the non-emission section NEP, the enable first scan signal GW is supplied to the first scan line SL1*i*, so that the second transistor M2 is turned on. Additionally, the disable second light emission control signal EM2 is supplied to the second light emission control line EL2*i*, so that the eighth transistor M8 is turned off. During this third section T3, the voltage of the data signal may be supplied to the third node N3.

During the fourth section T4 of the non-emission section NEP, the enable fourth scan signal GB is supplied to the fourth scan line SL4*i*, so that the ninth transistor M9 and the tenth transistor M10 are turned on. During the fourth section T4, the first electrode of the light emitting element LD may be initialized and the first transistor M1 may be set to the on bias state.

During the emission section EP, the enable first emission control signal EM1 is supplied to the first emission control line EL1*i* and the enable second emission control signal EM2 is supplied to the second emission control line EL2*i*. Then, the fifth transistor M5 and the eighth transistor M8 are turned on so that driving current can be supplied to the light emitting element LD.

FIGS. 5A to 5E are drawings illustrating an operation process of a pixel corresponding to a timing diagram of FIG. 4.

Figure 5A:
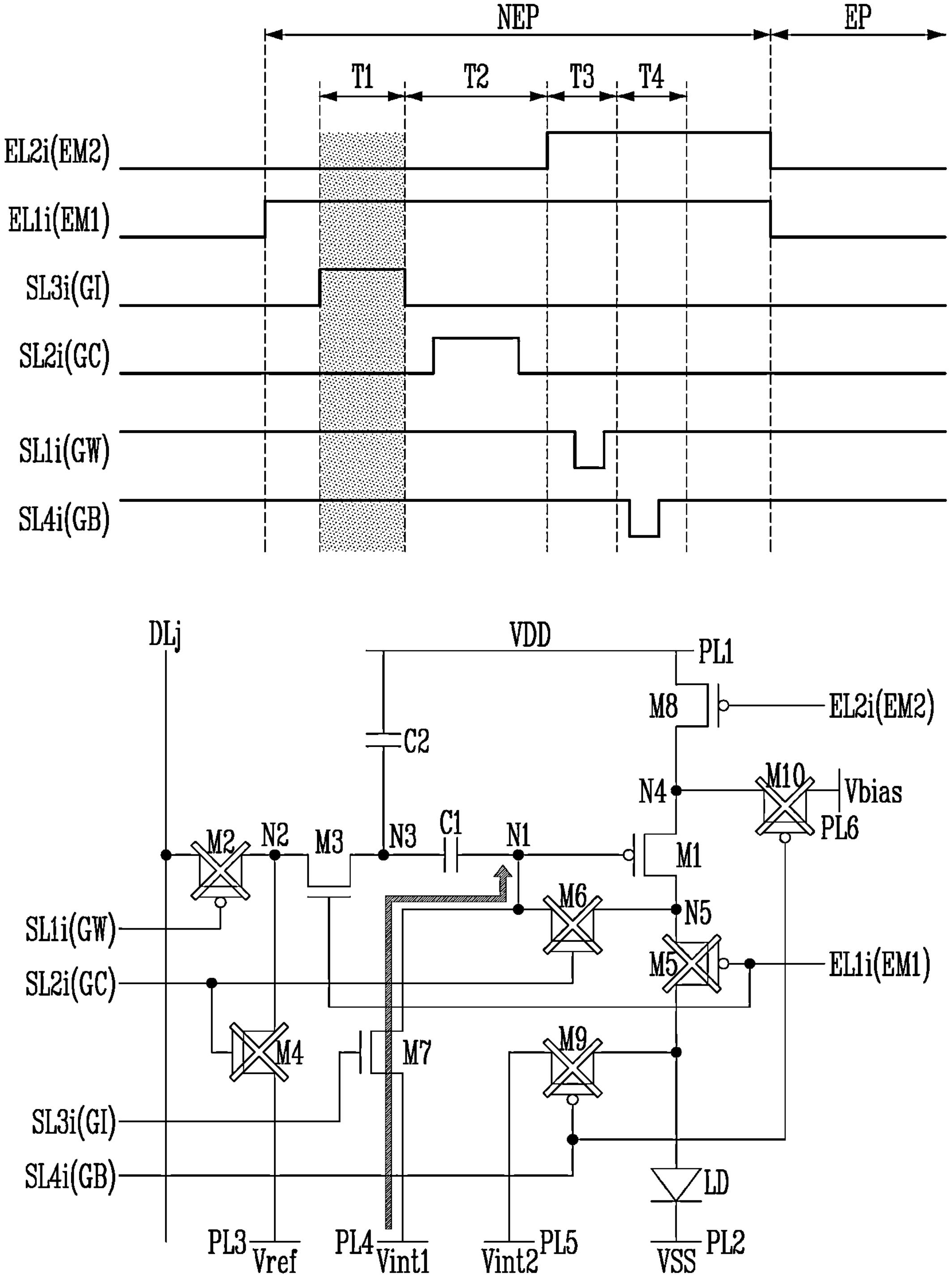
FIGS. 5A, 5B, 5C, 5D, and 5E are drawings illustrating an operation process of a pixel corresponding to a timing diagram of FIG. 4.

Referring to FIG. 5A, first, the disable first emission control signal EM1 is supplied to the first emission control line EL1*i* during the non-emission section NEP, and thus the fifth transistor M5 is turned off and the third transistor M3 is turned on.

When the fifth transistor M5 is turned off, the first transistor M1 and the light emitting element LD are electrically cut off, and thus the pixel PXij can be set to a non-emission state. When the third transistor M3 is turned on, the second node N2 and the third node N3 are electrically connected. The third transistor M3 may maintain the turn-on state during the non-emission section NEP.

During the first section T1, the enable third scan signal GI is supplied to the third scan line SL3*i*. When the enable third scan signal GI is supplied to the third scan line SL3*i*, the seventh transistor M7 is turned on. When the seventh transistor M7 is turned on, the voltage of the first initialization power Vint1 is supplied to the first node N1, and thus, the first node N1 may be initialized as the voltage of the first initialization power Vint1. The voltage of the first initialization power Vint1 may be set to a lower voltage than the first driving power VDD.

Figure 5B:
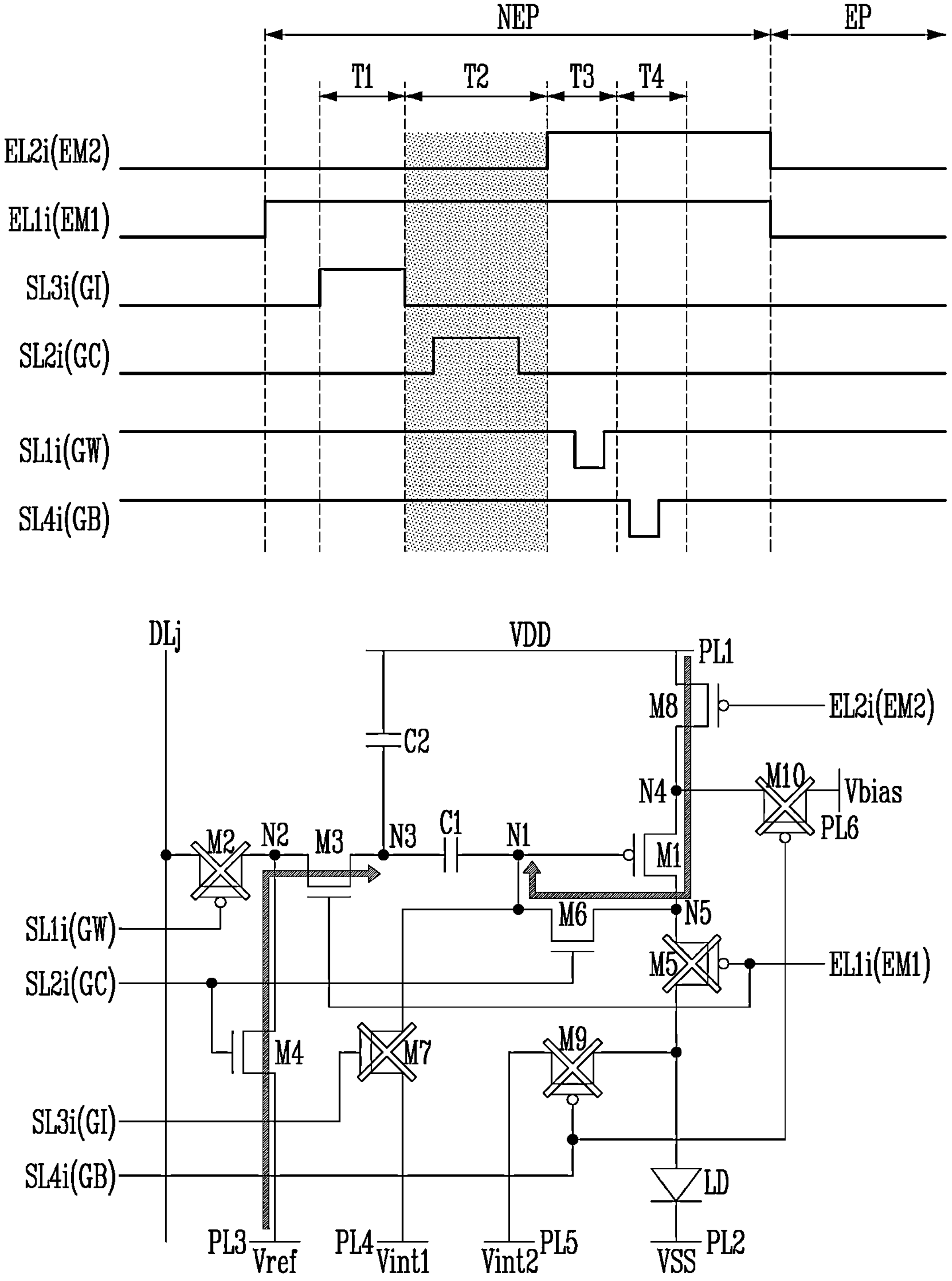

Referring to FIG. 5B, the enable second scan signal GC is supplied to the second scan line SL2*i* during the second section T2. When the enable second scan signal GC is supplied to the second scan line SL2*i*, the fourth transistor M4 and the sixth transistor M6 are turned on.

When the fourth transistor M4 is turned on, the voltage of the reference power Vref is supplied to the third node N3 via the second node N2, and thus the third node N3 (and second node N2) may be initialized to the voltage of the reference power Vref.

When the sixth transistor M6 is turned on, the first node N1 and the fifth node N5 are electrically connected. When the first node N1 and the fifth node N5 are electrically connected, the first transistor M1 is connected with a diode.

Meanwhile, the enable second emission control signal EM2 is supplied to the second emission control line EL2*i* during the second section T2, and thus the eighth transistor M8 maintains a turn-on state. Therefore, when the first transistor M1 is connected with a diode, the voltage of the first driving power VDD may be supplied from the first power line PL1 to the first node N1 via the first transistor M1. In this case, a voltage obtained by subtracting the absolute threshold voltage of the first transistor M1 from the first driving power VDD may be applied to the first node N1.

During the second section T2, a voltage corresponding to the difference between the reference power Vref and the first node N1 may be stored in the first capacitor C1. For example, when the reference power Vref is set to the same voltage as the first driving power VDD, a voltage corresponding to the threshold voltage of the first transistor M1 may be stored in the first capacitor C1.

Figure 5C:
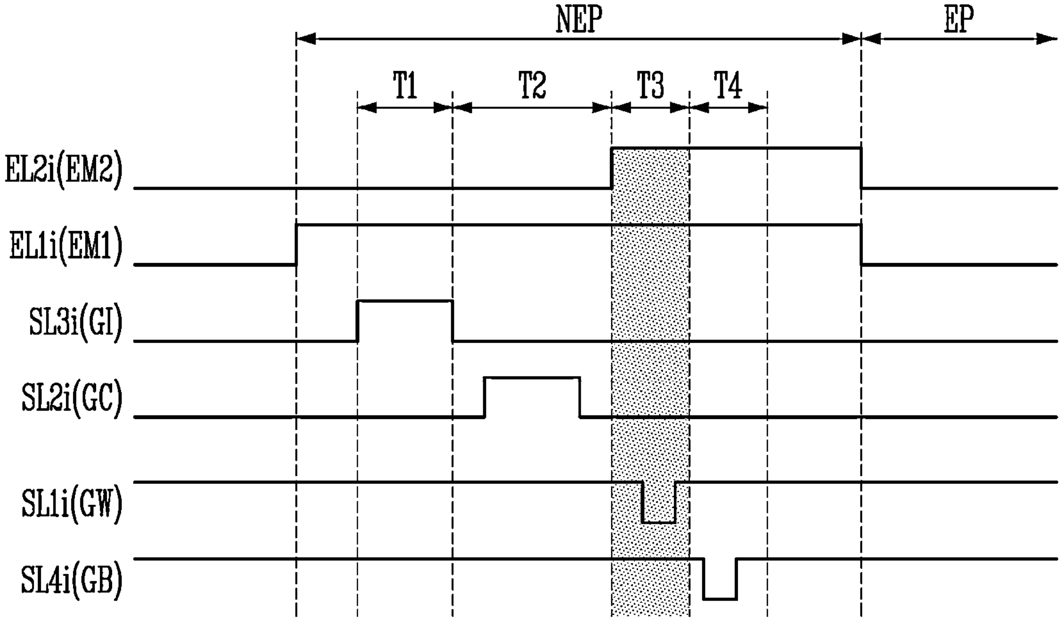
Figure 5C:
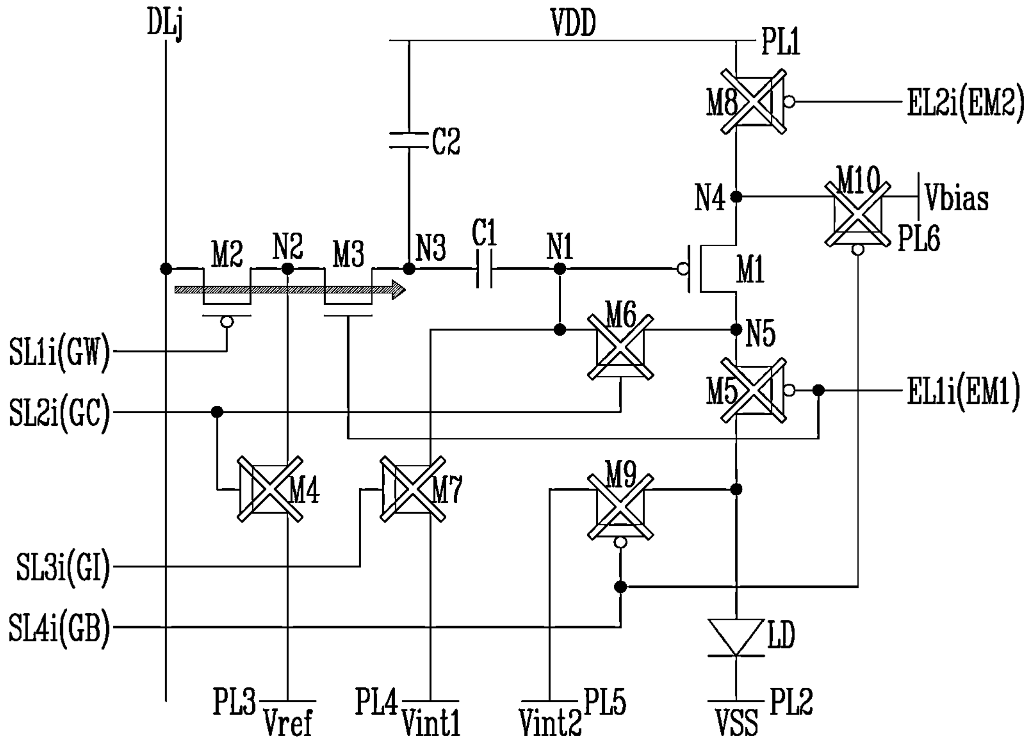

Referring to FIG. 5C, during the third section T3, the disable second emission control signal EM2 is supplied to the second emission control line EL2*i*, and the enable first scan signal GW is supplied to the first scan line SL1*i*.

When the disable second emission control signal EM2 is supplied to the second emission control line EL2*i*, the eighth transistor M8 is turned off. When the eighth transistor M8 is turned off, an electrical connection between the first power line PL1 and the fourth node N4 is blocked.

When the enable first scan signal GW is supplied to the first scan line SL1*i*, the second transistor M2 is turned on. When the second transistor M2 is turned on, the voltage of the data signal is supplied from the data line DLj to the second node N2. At this time, the voltage of the data signal is supplied to the second node N2 via the P-type second transistor M2, which is a polysilicon semiconductor transistor, and thus it may be stably supplied to the second node N2 within a predetermined time. The voltage of the data signal supplied to the second node N2 may be supplied to the third node N3 while charging a parasitic capacitor (not shown).

During the third section T3, the voltage of the third node N3 changes from the voltage of the reference power Vref to the voltage of the data signal. At this time, the change value in the voltage of the third node N3 may be transferred to the first node N1 by coupling of the first capacitor C1. Accordingly, during the third section T3, a voltage reflecting the threshold voltage of the first transistor M1 and the voltage of the data signal may be applied to the first node N1.

Figure 5D:
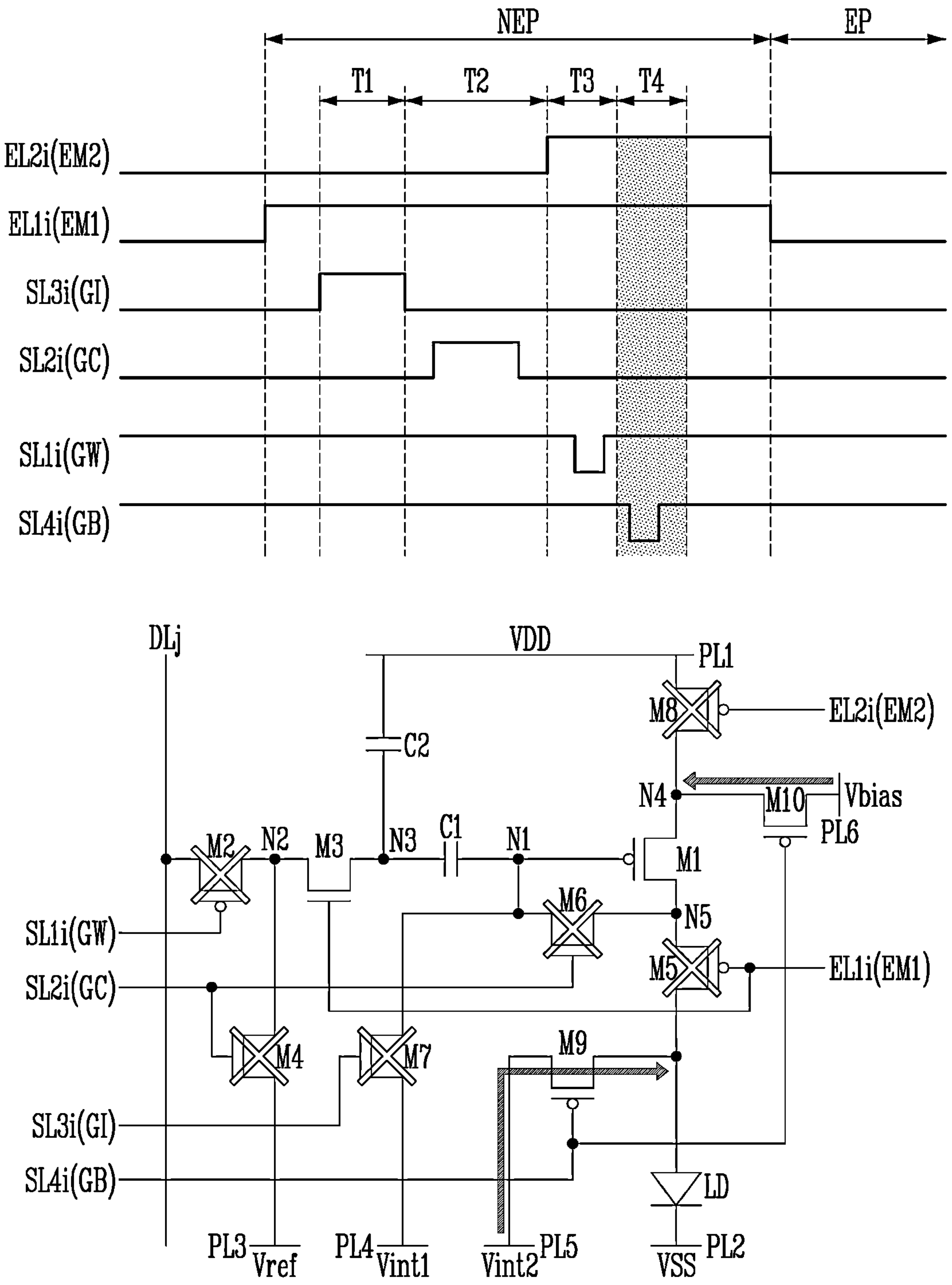

Referring to FIG. 5D, the disable first scan signal GW is supplied to the first scan line SL1*i* during the fourth section T4, and thus the second transistor M2 is turned off. Even if the second transistor M2 is turned off, the third transistor M3 remains a turned-on state, so the voltage of the data signal transferred to the second node N2 may be stably supplied to the third node N3. For example, during the fourth section T4, the voltage of the data signal charged in the parasitic capacitor of the second node N2 may be supplied to the third node N3.

During the fourth section T4, the enable fourth scan signal GB is supplied to the fourth scan line SL4*i*. When the enable fourth scan signal GB is supplied to the fourth scan line SL4*i*, the ninth transistor M9 and the tenth transistor M10 are turned on.

When the ninth transistor M9 is turned on, the voltage of the second initialization power Vint2 may be supplied from the fifth power line PL5 to the first electrode of the light emitting element LD. When the voltage of the second initialization power Vint2 is supplied to the first electrode of the light emitting element LD, the parasitic capacitor of the light emitting element LD is discharged, and thus the black display ability can be improved.

When the tenth transistor M10 is turned on, the voltage of the bias power Vbias may be supplied from the sixth power line PL6 to the fourth node N4. When the voltage of the bias power Vbias is supplied to the fourth node N4, characteristics of the first transistor M1 are initialized to a specific state (e.g., on bias state), and thus an image with uniform luminance can be displayed.

Figure 5E:
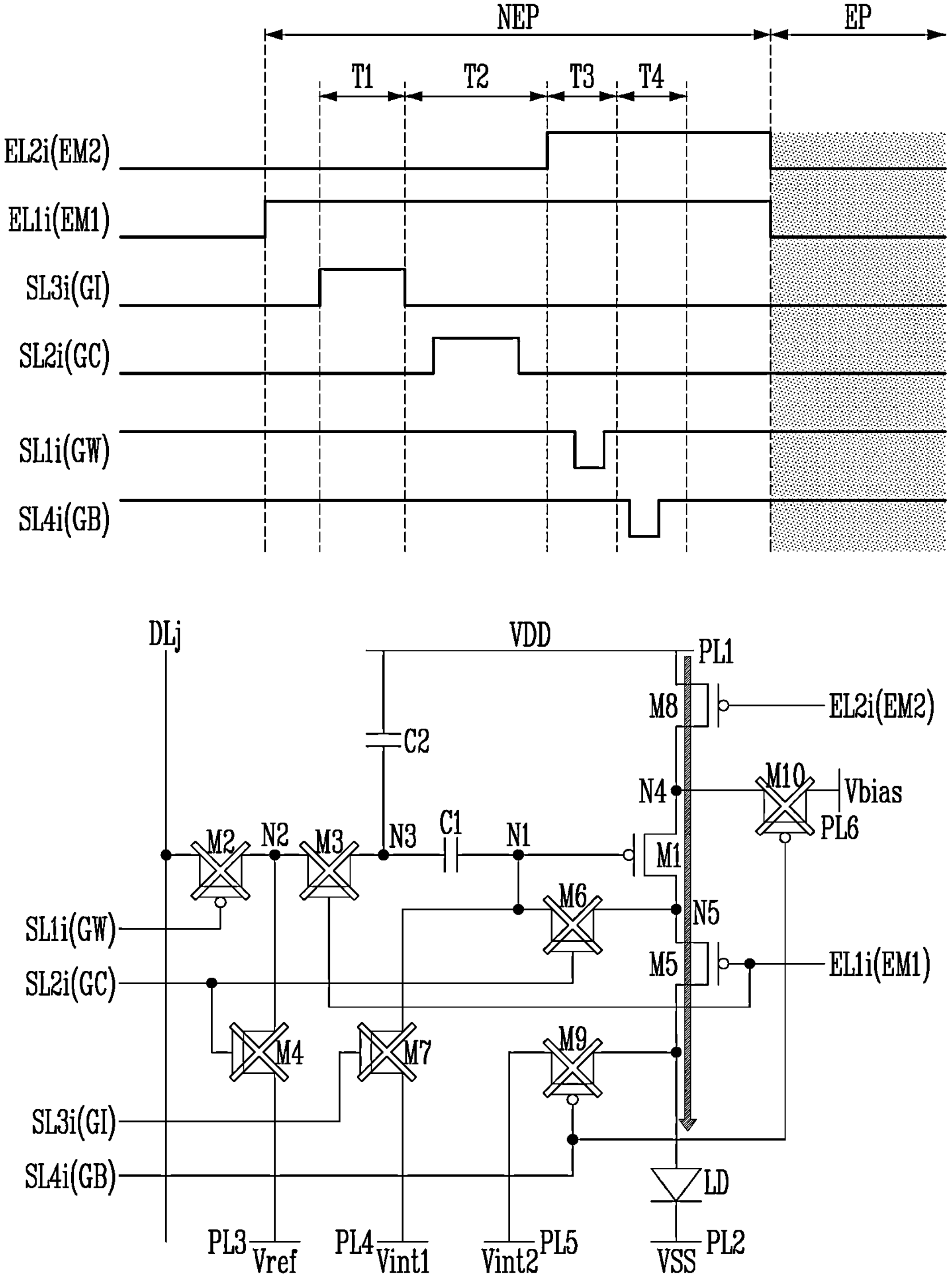

Referring to FIG. 5E, during the emission section EP, the enable first emission control signal EM1 is supplied to the first emission control line EL1*i*, and the enable second emission control signal EM2 is supplied to the second emission control line EL2*i*.

When the enable first emission control signal EM1 is supplied to the first emission control line EL1*i*, the fifth transistor M5 is turned on. When the fifth transistor M5 is turned on, the first transistor M1 and the light emitting element LD are electrically connected.

When the enable second emission control signal EM2 is supplied to the second emission control line EL2*i*, the eighth transistor M8 is turned on. When the eighth transistor M8 is turned on, the first power line PL1 and the first transistor M1 are electrically connected. Then, a current path leading to the second power line PL2 via the first power line PL1, the first transistor M1, the fifth transistor M5, and the light emitting element LD is formed.

At this time, the first transistor M1 may control the amount of current supplied from the first power line PL1 to the second power line PL2 in response to the voltage of the first node N1, and thus the light emitting element LD may emit light with a predetermined luminance.

In an embodiment, one frame period may further include one or more non-emission sections NEP. This may be to effectively express the low grayscale by reducing the emission section EP of the pixel PXij or to smoothly blur the motion of the image. Additionally, a non-emission section NEP may further include the non-emission sections NEP to drive the pixel PXij at a low driving frequency.

In the above-described embodiment, the voltage of the data signal can be transferred from the data line DLj to the pixel PXij using the P-type second transistor M2 capable of high-speed driving. Additionally, in an embodiment, the leakage current between the data line DLj and the pixel PXij can be prevented using the N-type third transistor M3. That is, in an embodiment, a switching transistor may be configured using the P-type second transistor M2 and the N-type third transistor M3, thereby improving display quality.

Figure 6:
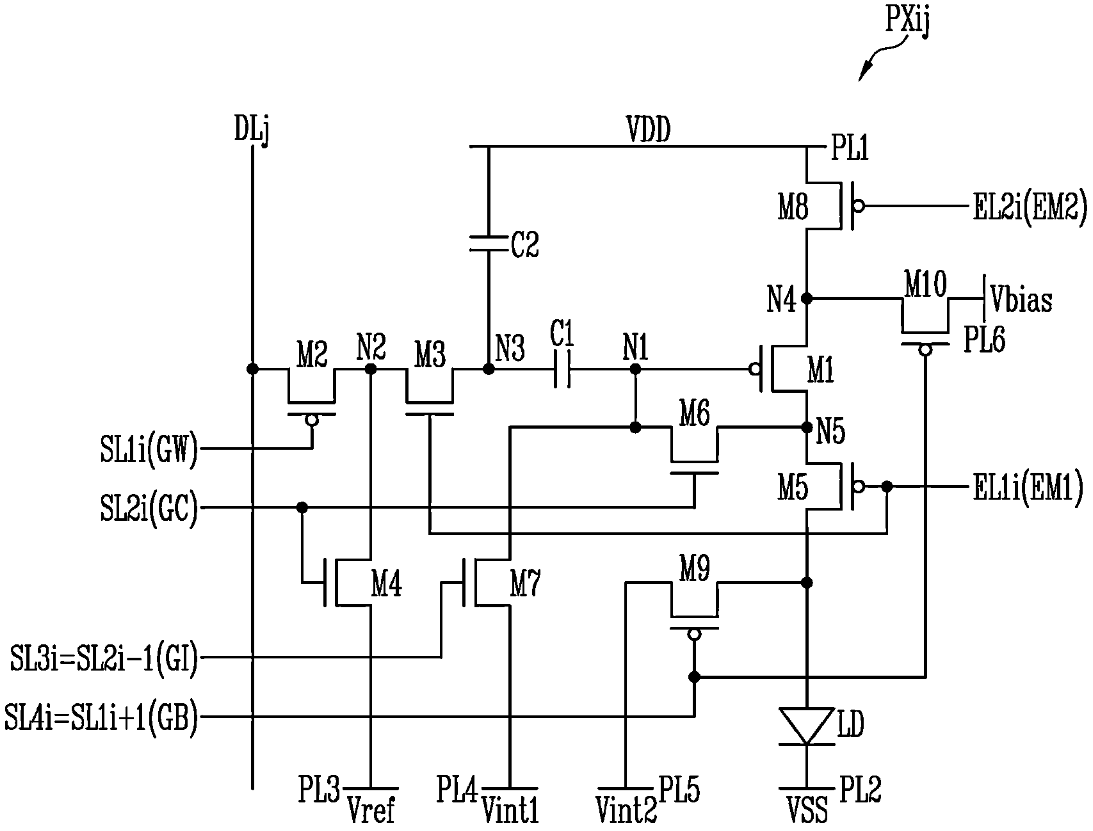
FIG. 6 illustrates an embodiment of a pixel shown in FIG. 1.
Figure 7:
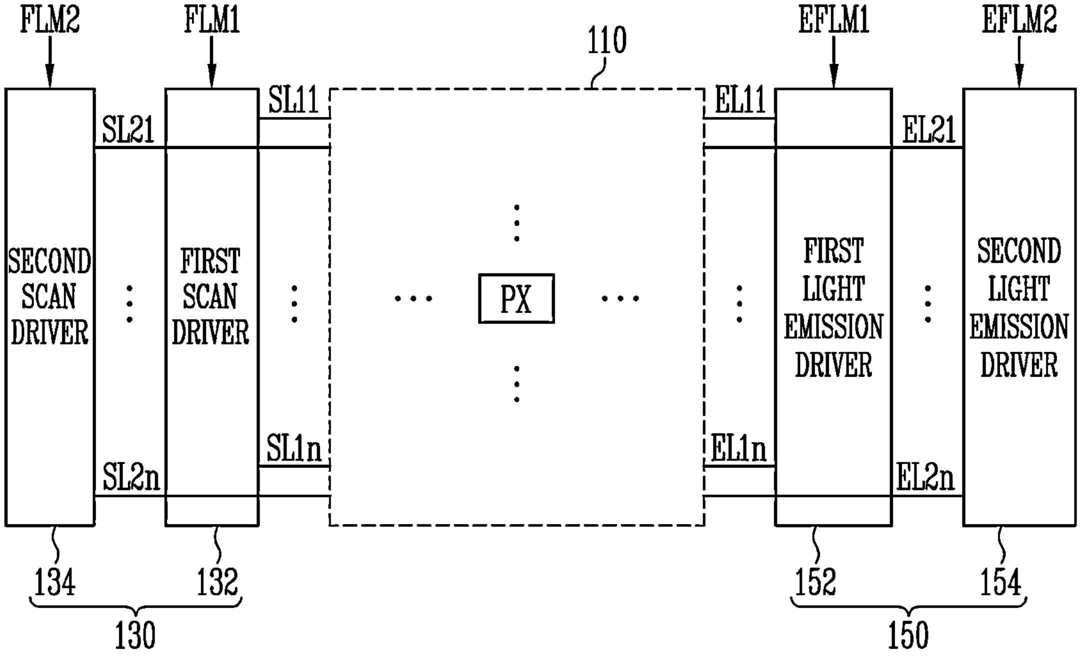
FIG. 7 illustrates an embodiment of a scan driver and a light emission driver shown in FIG. 1.

FIG. 6 illustrates an embodiment of a pixel shown in FIG. 1. FIG. 7 illustrates an embodiment of a scan driver and a light emission driver shown in FIG. 1. When describing FIGS. 6 and 7, descriptions that overlap with FIGS. 2 and 3 will be omitted.

Referring to FIG. 6, a gate electrode of the seventh transistor M7 is electrically connected to the third scan line SL3*i*. Here, the third scan line SL3*i* may be the second scan line SL2*i*−1 disposed on the previous horizontal line. In this case, as shown in FIG. 7, the second third scan driver 136 can be removed, thereby minimizing dead space.

Gate electrodes of the ninth transistor M9 and the tenth transistor M10 are electrically connected to the fourth scan line SL4*i*. Here, the fourth scan line SL4*i* may be the first scan line SL1*i*+1 disposed on the next horizontal line. In this case, as shown in FIG. 7, the fourth scan driver 138 shown in FIG. 2 may be removed, thereby minimizing dead space.

Although the above has been described with reference to the embodiments of the present disclosure, those skilled in the art will understand that various modifications and changes can be made to the present disclosure without departing from the spirit and scope of the present disclosure as set forth in the claims.

What is claimed is:

1. A pixel comprising:

a light emitting element connected between a first power line and a second power line;

a first transistor connected between the first power line and a first electrode of the light emitting element, and having a gate electrode connected to a first node;

a second transistor connected between a data line and a second node, and having a gate electrode electrically connected to a first scan line;

a third transistor connected between the second node and a third node, having a gate electrode electrically connected to a first light emission control line;

a first capacitor connected between the first node and the third node;

a fourth transistor connected between the second node and a third power line supplied with reference power, and having a gate electrode electrically connected to a second scan line;

a fifth transistor connected between the first transistor and the first electrode of the light emitting element, and having a gate electrode electrically connected to the first light emission control line; and a second capacitor connected between the first power line and the third node, wherein the third transistor and the fifth transistor are alternately turned on and off.

2. The pixel of claim 1, wherein the second transistor is a P-type transistor, and the third transistor is an N-type transistor.

3. The pixel of claim 2, wherein the second transistor is a polysilicon semiconductor transistor, and the third transistor is an oxide semiconductor transistor.

4. The pixel of claim 1, wherein the second transistor is turned on after the third transistor is turned on, and the third transistor is turned off after the second transistor is turned off.

5. The pixel of claim 1, wherein a first driving power is supplied to the first power line, and a second driving power having a lower voltage value than the first driving power is supplied to the second power line.

6. The pixel of claim 1, wherein the fourth transistor is an N-type transistor, and the fifth transistor is a P-type transistor.

7. A pixel comprising:

a light emitting element connected between a first power line and a second power line;

a first transistor connected between the first power line and a first electrode of the light emitting element, and having a gate electrode connected to a first node;

a second transistor connected between a data line and a second node, and having a gate electrode electrically connected to a first scan line;

a third transistor connected between the second node and a third node, having a gate electrode electrically connected to a first light emission control line;

a first capacitor connected between the first node and the third node;

a fourth transistor connected between the second node and a third power line supplied with reference power, and having a gate electrode electrically connected to a second scan line;

a fifth transistor connected between the first transistor and the first electrode of the light emitting element, and having a gate electrode electrically connected to the first light emission control line;

a second capacitor connected between the first power line and the third node;

a sixth transistor connected between the first node and a common node between the first transistor and the fifth transistor, and having a gate electrode electrically connected to the second scan line;

a seventh transistor connected between the first node and a fourth power line to which a first initialization power is supplied, and having a gate electrode electrically connected to a third scan line;

an eighth transistor connected between the first power line and the first transistor, and having a gate electrode connected to a second light emission control line;

a ninth transistor connected between a first electrode of the light emitting element and a fifth power line to which a second initialization power is supplied, and having a gate electrode electrically connected to a fourth scan line; and a tenth transistor connected between a common node between the eighth transistor and the first transistor and a sixth power line to which bias power is supplied and having a gate electrode electrically connected to the fourth scan line.

8. The pixel of claim 7, wherein the eighth transistor, the ninth transistor, and the tenth transistor are P-type transistors, and the sixth transistor and the seventh transistor are N-type transistors.

9. An electronic device comprising:

a processor to provide input data, and a display device to display an image based on the input data, wherein the display device includes:

a scan driver for driving first scan lines, second scan lines, third scan lines, and fourth scan lines;

a data driver for driving data lines;

a light emission driver for driving first light emission control lines and second light emission control lines; and pixels disposed to be connected to the first scan lines, the second scan lines, the third scan lines, the fourth scan lines, the data lines, the first emission control lines, and the second emission control lines, wherein a first pixel disposed at an i-th (i is a natural number) horizontal line and a j-th (j is a natural number) vertical line, the first pixel includes:

a light emitting element connected between a first power line and a second power line;

a first transistor connected between the first power line and a first electrode of the light emitting element, and having a gate electrode connected to a first node;

a second transistor connected between a j-th data line and a second node and turned on when an enable first scan signal is supplied to an i-th first scan line;

a third transistor connected between the second node and a third node and turned on when a disable first emission control signal is supplied to an i-th first emission control line; and a first capacitor connected between the first node and the third node, wherein the first pixel further includes:

a fourth transistor connected between the second node and a third power line and turned on when an enable second scan signal is supplied to an i-th second scan line;

a fifth transistor connected between the first transistor and a first electrode of the light emitting element and turned on when an enable first light emission control signal is supplied to the i-th first light emission control line; and a second capacitor connected between the first power line and the third node, and wherein the third transistor and the fifth transistor are alternately turned on and off.

10. The electronic device of claim 9, wherein the second transistor is a P-type transistor, and the third transistor is an N-type transistor.

11. The electronic device of claim 10, wherein the second transistor is a polysilicon semiconductor transistor, and the third transistor is an oxide semiconductor transistor.

12. The electronic device of claim 9, wherein the first pixel further includes:

a sixth transistor connected between the first node and a common node between the first transistor and the fifth transistor, and turned on when the enable second scan signal is supplied to the i-th second scan line;

a seventh transistor connected between the first node and a fourth power line and turned on when an enable third scan signal is supplied to an i-th third scan line;

an eighth transistor connected between the first power line and the first transistor and turned on when an enable second light emission control signal is supplied to an i-th second light emission control line;

a ninth transistor connected between a first electrode of the light emitting element and a fifth power line, and turned on when an enable fourth scan signal is supplied to an i-th fourth scan line; and a tenth transistor connected between a common node between the eighth transistor and the first transistor and a sixth power line, and turned on when an enable fourth scan signal is supplied to the i-th fourth scan line.

13. The electronic device of claim 12, wherein the fifth transistor, the eighth transistor, the ninth transistor, and the tenth transistor are P-type transistors, and the fourth transistor, the sixth transistor, and the seventh transistor are N-type transistors.

14. The electronic device of claim 12, wherein the i-th third scan line is set to an i-1th second scan line disposed on a previous horizontal line, and the i-th fourth scan line is set to an i+1th first scan line disposed on a next horizontal line.

15. The electronic device of claim 12, further comprising a power supply unit for supplying a first driving power to the first power line, a second driving power to the second power line, a reference power to the third power line, a first initialization power to the fourth power line, the second initialization power to the fifth power line, and a bias power to the sixth power line.

16. The electronic device of claim 15, wherein the first driving power is set to a higher voltage than the second driving power, and the first initialization power and the second initialization power are set to a lower voltage than the first driving power.

* * * * *